US008058219B2

(12) United States Patent
Rath et al.

(10) Patent No.: US 8,058,219 B2
(45) Date of Patent: Nov. 15, 2011

(54) METALS COMPATIBLE POST-ETCH PHOTORESIST REMOVER AND/OR SACRIFICIAL ANTIREFLECTIVE COATING ETCHANT

(75) Inventors: Melissa K. Rath, Danbury, CT (US); David D. Bernhard, Kooskia, ID (US); Thomas H. Baum, New Fairfield, CT (US); Ping Jiang, Danbury, CT (US); Renjie Zhou, Dayton, NJ (US); Michael B. Korzenski, Danbury, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 440 days.

(21) Appl. No.: 12/090,213

(22) PCT Filed: Oct. 12, 2006

(86) PCT No.: PCT/US2006/039888
§ 371 (c)(1),
(2), (4) Date: Oct. 6, 2008

(87) PCT Pub. No.: WO2007/047365
PCT Pub. Date: Apr. 26, 2007

(65) Prior Publication Data
US 2009/0118153 A1    May 7, 2009

Related U.S. Application Data
(60) Provisional application No. 60/726,410, filed on Oct. 13, 2005.

(51) Int. Cl.
*C11D 3/39* (2006.01)

(52) U.S. Cl. .......................... 510/175; 510/176; 134/1.3
(58) Field of Classification Search .................. 510/175, 510/176, 220, 226, 376; 134/1.3
See application file for complete search history.

(56) References Cited

U.S. PATENT DOCUMENTS

| 6,551,973 | B1 | 4/2003 | Moore |
| 6,599,370 | B2 | 7/2003 | Skee |
| 6,752,878 | B2 * | 6/2004 | Montano et al. ............... 148/243 |
| 2002/0072482 | A1 * | 6/2002 | Sachdev et al. ................ 510/175 |
| 2004/0180300 | A1 * | 9/2004 | Minsek et al. ................. 430/329 |
| 2005/0197265 | A1 * | 9/2005 | Rath et al. ..................... 510/175 |

FOREIGN PATENT DOCUMENTS

| EP | 1128221 A2 | 8/2001 |
| WO | 0213242 A2 | 2/2002 |
| WO | 2004059700 A2 | 7/2004 |
| WO | 2006074316 A1 | 7/2006 |

OTHER PUBLICATIONS

European Patent Office, Supplemental European Search Report, Dec. 5, 2008.

* cited by examiner

*Primary Examiner* — Gregory Webb
(74) *Attorney, Agent, or Firm* — Tristan A. Fuierer; Moore & Van Allen PLLC; Rosa Yaghmour

(57) ABSTRACT

A liquid removal composition and process for removing photoresist and/or sacrificial anti-reflective coating (SARC) material from a microelectronic device having same thereon. The liquid removal composition includes at least one organic quaternary base and at least one surface interaction enhancing additive. The composition achieves at least partial removal of photoresist and/or SARC material in the manufacture of integrated circuitry with minimal etching of metal species on the microelectronic device, such as copper and cobalt, and without damage to low-k dielectric materials employed in the microelectronic device architecture.

20 Claims, No Drawings

METALS COMPATIBLE POST-ETCH PHOTORESIST REMOVER AND/OR SACRIFICIAL ANTIREFLECTIVE COATING ETCHANT

CROSS-REFERENCE TO RELATED APPLICATIONS

This application is filed under the provisions of 35 U.S.C. §371 and claims the priority of International Patent Application No. PCT/US2006/039888 filed on 12 Oct. 2006, which claims priority to U.S. Provisional Patent Application No. 60/726,410 filed on 13 Oct. 2005, which are both hereby incorporated herein in their entireties.

FIELD OF THE INVENTION

The present invention relates to liquid removal compositions and processes useful in microelectronic device manufacturing processes, particularly for photoresist removal and silicate stripping, e.g., liquid removal of sacrificial anti-reflective silicate material, from a microelectronic device having such material deposited thereon, particularly where the sacrificial anti-reflective silicate material is present with permanent silicate materials and interconnect metals desired to be unaffected by the liquid removal composition.

DESCRIPTION OF THE RELATED ART

Currently, there are four developed wavelengths of radiation used in the photolithographic industry—436 nm, 365 nm, 248 nm, and 193 nm—and recent efforts have focused on 157 nm lithography processes. In theory, with each wavelength decrease, smaller features can be created on the microelectronic device chip. However, because the reflectivity of the microelectronic device substrate is inversely proportional to the photolithographic wavelength, interference and unevenly exposed photoresist have limited the consistency of the critical dimensions of the microelectronic device.

For example, upon exposure to DUV radiation, it is well known that the transmissivity of photoresist combined with the high reflectivity of the substrates to the DUV wavelengths results in the reflection of the DUV radiation back into the photoresist thereby producing standing waves in the photoresist layer. The standing waves trigger further photochemical reactions in the photoresist causing an uneven exposure of the photoresist, including in the masked portions not intended to be exposed to the radiation, which results in variations in linewidths, spacing and other critical dimensions.

In order to address the transmissivity and reflectivity problems, bi- and tri-layer photoresists, bottom anti-reflective coatings (BARCs), and sacrificial anti-reflective coatings (SARCs) have been developed which are applied to substrates prior to applying the photoresist. All of these antireflective coatings have a planarizing effect on topological wafer surfaces encountered in typical dual damascene integration and all incorporate a UV chromophore into a spin-on polymer matrix which will absorb incident UV radiation.

When used with SiOC-based dielectrics, SARCs have two important advantages: SARCs are TEOS-based and thus etch at the same rate as SiOC dielectrics, which allows for much greater etch uniformity and control such that the trench etch stop can be eliminated and via etch stop can be reduced in thickness by up to 50%; and etched SARCs can be removed using liquid removal compositions because there is not a significant increase in post-etch cross-linking in etched SARCs relative to etched photoresist and etched BARCs.

Untreated photoresist possesses solubility in strong aqueous alkaline solutions as well as solutions of select organic solvents. However, photoresist that has been exposed to gas-phase plasma etching, such as is typically used for etching of dielectric materials, will develop a hardened crust on the surface of the material. The hardened crust is composed of cross-linked organic polymer and may contain small amounts of silicon or metal atoms. Fluorine-based plasma etches as used in dual damascene processes may deposit fluorine atoms in the photoresist crust, which may decrease its solubility and increase its resistance to chemical removal.

The clean removal of hardened photoresist and/or SARC materials from the microelectronic device wafer has proven to be difficult and/or costly. If not removed, the layers may interfere with subsequent silicidation or contact formation. Typically, the layers are removed by oxidative or reductive plasma ashing or wet cleaning. However, plasma ashing, whereby the substrate is exposed to an oxidative or reductive plasma etch, may result in damage to the dielectric material, either by changing the feature shapes and dimensions, or by an increase in the dielectric constant of the dielectric material. The latter problem is more pronounced when low-k dielectric materials, such as organosilicate glasses (OSG) or carbon-doped oxide glasses, are the underlying dielectric material. As such, it is often desirable to avoid the use of plasma ashing to remove the hardened photoresist and/or SARC layers.

When a cleaner/etchant composition is used in back-end-of-line (BEOL) applications to process aluminum, copper or cobalt interconnected wires, it is important that the composition possess good metal compatibility, e.g., a low etch rate on copper, aluminum, cobalt, etc., and that the permanent silicate materials be unaffected by the cleaner composition. Aqueous removal solutions are preferred because of the simpler disposal techniques, however, the photoresist "crust" is typically extremely insoluble in aqueous cleaners, especially cleaners that do not damage the dielectric. Moreover, aqueous removal solutions are known to etch the metal interconnects.

Hydrogen fluoride (HF) solutions may be used to etch silicon oxide materials. However, HF solutions etch silicon oxides rapidly and non-selectively, and thereby may cause damage or loss of other silicate-containing materials in the device, especially silicate materials that are commonly used as ILDs. Such ILD materials include, by way of example, silicon dioxide, fluorinated silicate glass (FSG), and organosilicate glass (OSG), including both porous and non-porous materials.

Accordingly, there is a need in the art for HF-free liquid removal compositions that can completely and efficiently remove photoresist and/or SARC layers from the microelectronic device while simultaneously minimizing damage to the co-extensively present dielectric materials and/or interconnect metals.

SUMMARY OF THE INVENTION

The present invention relates to a liquid removal composition and process useful in microelectronic device manufacturing processes, particularly for the removal of sacrificial anti-reflective silicate material and photoresist material from a microelectronic device having such material deposited thereon, particularly where the sacrificial anti-reflective silicate material is present with permanent silicate materials and interconnect metals desired to be unaffected by said composition.

One aspect of the invention relates to substrate treatment formulations such as cleaning formulations comprising surface interaction enhancing agents including, but not limited to, poly(acrylamide-co-diallyldiemethylammonium chloride), poly(acrylamide), poly(acrylic acid), poly(diallyldiemethylammonium chloride), diallyldimethylammonium chloride, acrylamide, acetoguanamine, and combinations thereof. Preferably, the treatment formulation comprises less than 50 wt % water, more preferably less than 40 wt % water, even more preferably less than 30 wt % water and even more preferably less than 25 wt % water.

In another aspect, the present invention relates to a liquid removal composition comprising at least one organic quaternary base, at least one surface interaction enhancing additive, and optionally at least one component selected from the group consisting of: at least one alkali or alkaline earth metal source; at least one organic solvent; at least one surfactant; at least one chelating agent; and combinations thereof, wherein said liquid removal composition is useful for removing photoresist and/or sacrificial anti-reflective coating (SARC) materials from a microelectronic device having such material(s) thereon. Preferably, the liquid removal composition is devoid of abrasive materials and is not supercritical or subcritical.

In still another aspect, the present invention relates to a liquid removal composition comprising at least one organic quaternary base, at least one alkali or alkaline earth metal source, at least one organic solvent, at least one surface interaction enhancing additive, optionally at least one surfactant, and optionally at least one chelating agent, wherein said liquid removal composition is useful for removing photoresist and/or sacrificial anti-reflective coating (SARC) materials from a microelectronic device having such material(s) thereon.

In yet another aspect, the present invention relates to a kit comprising, in one or more containers, one or more of the following reagents for forming a liquid removal composition, said one or more reagents selected from the group consisting of at least one organic quaternary base, at least one surface interaction enhancing additive, and optionally at least one component selected from the group consisting of: at least one alkali or alkaline earth metal source; at least one organic solvent; at least one surfactant; at least one chelating agent; and combinations thereof, and wherein the kit is adapted to form the liquid removal composition suitable for removing photoresist and/or SARC materials from a microelectronic device having said material(s) thereon.

In still another aspect, the present invention relates to a method of removing material from a microelectronic device having said material thereon, said method comprising contacting the microelectronic device with a liquid removal composition for sufficient time to at least partially remove said material from the microelectronic device, wherein the liquid removal composition comprises at least one organic quaternary base, at least one surface interaction enhancing additive, and optionally at least one component selected from the group consisting of: at least one alkali or alkaline earth metal source; at least one organic solvent; at least one surfactant; at least one chelating agent; and combinations thereof.

In yet another aspect, the present invention relates to a method of removing photoresist and/or SARC material from a microelectronic device having said material thereon, said method comprising contacting the microelectronic device with a liquid removal composition for sufficient time to at least partially remove said material from the microelectronic device, wherein the liquid removal composition comprises at least one organic quaternary base, at least one surface interaction enhancing additive, and optionally at least one component selected from the group consisting of: at least one alkali or alkaline earth metal source; at least one organic solvent; at least one surfactant; at least one chelating agent; and combinations thereof.

In a further aspect, the present invention relates to a method of removing photoresist and/or SARC material from a microelectronic device having said material thereon, said method comprising contacting the microelectronic device with a liquid removal composition for sufficient time to at least partially remove said material from the microelectronic device, wherein the liquid removal composition comprises at least one organic quaternary base, at least one alkali or alkaline earth metal source, at least one organic solvent, at least one surface interaction enhancing additive, optionally at least one surfactant, and optionally at least one chelating agent.

Another aspect of the invention relates to an article of manufacture comprising a liquid removal composition, a microelectronic device, and photoresist and/or SARC material thereon, wherein the liquid removal composition comprises at least one organic quaternary base, at least one surface interaction enhancing additive, and optionally at least one component selected from the group consisting of: at least one alkali or alkaline earth metal source; at least one organic solvent; at least one surfactant; at least one chelating agent; and combinations thereof.

In a further aspect, the present invention relates to a method of manufacturing a microelectronic device, said method comprising contacting the microelectronic device with a liquid removal composition for sufficient time to at least partially remove photoresist and/or SARC material from the microelectronic device, wherein the liquid removal composition includes at least one organic quaternary base, at least one surface interaction enhancing additive, and optionally at least one component selected from the group consisting of: at least one alkali or alkaline earth metal source; at least one organic solvent; at least one surfactant; at least one chelating agent; and combinations thereof.

Yet another aspect of the invention relates to improved microelectronic devices, and products incorporating same, made using the methods of the invention comprising the removal of photoresist and/or SARC material from the microelectronic device having said material thereon, using the methods and/or compositions described herein, and optionally, incorporating the microelectronic device into a product.

A still further aspect of the invention relates to a liquid removal composition comprising at least one co-solvent and at least one surface interaction enhancing additive, wherein said surface interaction enhancing additive comprises a species selected from the group consisting of poly(acrylamide-co-diallyldiemthylammonium chloride), poly(acrylamide), poly(acrylic acid), poly(diallyldiemthylammonium chloride), diallyldimethylammonium chloride, acrylamide, acetoguanamine, and combinations thereof, and wherein said removal composition is useful for removing photoresist and/or sacrificial anti-reflective coating (SARC) materials from a microelectronic device having such material(s) thereon. Preferably, the removal composition is devoid of abrasive and is not supercritical or subcritical.

Other aspects, features and embodiments of the invention will be more fully apparent from the ensuing disclosure and appended claims.

DETAILED DESCRIPTION OF THE INVENTION, AND PREFERRED EMBODIMENTS THEREOF

The present invention contemplates liquid removal compositions that are useful to remove photoresist and/or sacrificial anti-reflective coating (SARC) materials from a microelectronic device having such material(s) thereon.

For ease of reference, "microelectronic device" corresponds to semiconductor substrates, flat panel displays, and microelectromechanical systems (MEMS), manufactured for use in microelectronic, integrated circuit, or computer chip applications. It is to be understood that the term "microelectronic device" is not meant to be limiting in any way and includes any substrate that will eventually become a microelectronic device or microelectronic assembly.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As used herein, "about" is intended to correspond to ±5% of the stated value.

As used herein, "suitability" for removing photoresist and/or SARC materials from a microelectronic device having said material(s) thereon corresponds to at least partial removal of said material(s) from the microelectronic device. Preferably, at least about 90% of the material(s), more preferably at least 95% of the material(s), and most preferably at least 99% of the material(s), is removed from the microelectronic device using the compositions of the invention.

As defined herein, "photoresist" includes, but is not limited to, developed and undeveloped photoresist material, photoresist that has been plasma etched, e.g., hardened during BEOL dual-damascene processing of integrated circuits, and/or photoresist that has been ion implanted, e.g., during front-end-of-line (FEOL) processing to implant dopant species in the appropriate layers of the semiconductor wafer. Photoresist that has ion implanted during FEOL processing may include species selected from the group consisting of boron, arsenic and phosphorus and as such, the post-etch residue may include said species.

"Post-etch residue," as used herein, corresponds to material remaining following gas-phase plasma etching processes, e.g., BEOL dual-damascene processing. The post-etch residue may be organic, organometallic, organosilicic, or inorganic in nature, for example, silicon-containing material, nitrogen-containing material, oxygen-containing material, polymeric residue material, copper-containing residue material, etch gas residue such as chlorine and fluorine, and combinations thereof.

Compositions of the invention may be embodied in a wide variety of specific formulations, as hereinafter more fully described.

Importantly, the liquid removal compositions of the present invention must possess good metal compatibility, e.g., a low etch rate on the metal. Metals of interest include, but are not limited to, copper, tungsten, cobalt, aluminum, tantalum, molybdenum, nickel, ruthenium, silicides thereof, alloys thereof, and combinations thereof.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In one aspect, the present invention relates to liquid removal compositions useful in removing photoresist and/or SARC layers from a microelectronic device substrate. Broadly, the formulation of the present invention includes at least one organic quaternary base, water, optionally at least one alkali or alkaline earth metal source, optionally at least one solvent, amine or combination thereof, optionally at least one chelator/passivation agent, optionally at least one surface interaction enhancing additive, and optionally at least one surfactant. The formulation may include at least one organic quaternary base, water, at least one surface interaction enhancing additive, optionally at least one alkali or alkaline earth metal source, optionally at least one solvent, amine or combination thereof, optionally at least one chelator/passivation agent, and optionally at least one surfactant. In one embodiment, the formulation includes at least one organic quaternary base, water, at least one alkali or alkaline earth metal source, at least one solvent, amine or combination thereof, and at least one chelator/passivation agent. In another embodiment, the formulation includes at least one organic quaternary base, water, at least one alkali or alkaline earth metal source, at least one solvent, amine or combination thereof, at least one surface interaction enhancing additive, optionally at least one chelator/passivation agent, and optionally at least one surfactant. Still another embodiment relates to a formulation including at least one organic quaternary base, water, at least one alkali or alkaline earth metal source, at least one chelator/passivation agent, and at least one surface interaction enhancing additive. In still another embodiment, the formulation includes at least one organic quaternary base, water, at least one alkali or alkaline earth metal source, at least one surface interaction enhancing additive, and at least one surfactant. In another embodiment, the formulation includes at least one organic quaternary base, water, at least one solvent, ainine or combination thereof, at least one surface interaction enhancing additive, and at least one surfactant. In still another embodiment, the formulation includes at least one organic quaternary base, water, at least one alkali or alkaline earth metal source, at least one solvent, amine or combination thereof, at least one surface interaction enhancing additive, and at least one surfactant. In yet another embodiment, the formulation includes at least one organic quaternary base, water, at least one alkali or alkaline earth metal source, at least one solvent, amine or combination thereof, at least one chelator/passivation agent, and at least one surface interaction enhancing additive.

Broadly, the formulation of the present invention includes the following components, present in the following ranges, based on the total weight of the composition:

| component of | % by weight |
| --- | --- |
| organic quaternary base(s) | about 0.01% to about 30.0% |
| alkali or alkaline earth metal source(s) | 0 to about 5.0% |
| solvent(s), amine(s) or combination thereof | 0 to about 90.0% |
| chelator/passivation agent(s) | 0% to about 10.0% |
| surfactant(s) | 0% to about 10.0% |
| surface interaction enhancing additive(s) | 0% to about 10.0% |
| water | 0.01% to about 98.0% |

The lower limit of each optional component, when present, is about 0.01 wt %, with the exception of the alkali or alkaline earth metal source(s), which may be as low as about 0.001 wt %.

In the broad practice of the invention, the liquid removal composition may comprise, consist of, or consist essentially of: (i) organic quaternary base(s), water, alkali or alkaline earth metal source(s), solvent(s), amine(s) or combinations thereof, and chelator/passivation agent(s); (ii) organic quaternary base(s), water, alkali or alkaline earth metal source(s), solvent(s), amine(s) or combinations thereof, surface interaction enhancing additive(s), optional chelator/passivation agent(s), and optional surfactant(s); (iii) organic quaternary base(s), water, alkali or alkaline earth metal source(s), chelator/passivation agent(s), and surface interaction enhancing additive(s); (iv) organic quaternary base(s), water, ne alkali or alkaline earth metal source(s), surface interaction enhancing additive(s), and surfactant(s); (v) organic quaternary base(s), water, solvent(s), amine(s) or combinations thereof, surface interaction enhancing additive(s), and surfactant(s); (vi) organic quaternary base(s), water, alkali or alkaline earth metal source(s), solvent(s), amine(s) or combinations thereof, surface interaction enhancing additive(s), and surfactant(s); (vii) organic quaternary base(s), water, alkali or alkaline earth metal source(s), solvent(s), amine(s) or combinations thereof, chelator/passivation agent(s), and surface interaction enhancing additive(s); or (viii) organic quaternary base(s), water, surface interaction enhancing additive(s), optional alkali or alkaline earth metal source(s), optional solvent(s), amine(s) or combinations thereof, optional chelator/passivation agent(s), and optional surfactant(s). In general, the specific proportions and amounts of the components, in relation to each other, may be suitably varied to provide the desired removal action of the liquid removal composition for the photoresist and/or SARC layer species and/or processing equipment, as readily determinable within the skill of the art without undue effort.

Compositions of the invention may be embodied in a wide variety of specific formulations, as hereinafter more fully described. In addition, when the compositions are formulated for the removal of photoresist and/or SARC layers from a microelectronic device substrate, the compositions are substantially devoid of abrasive, e.g., alumina, silica, titania, ceria, zirconia, germania, magnesia, co-formed products thereof, and combinations thereof, fluoride species, and oxoammonium compounds such as hydroxylamine and derivatives of hydroxylamine. "Substantially devoid" is defined herein as less than 2 wt. %, preferably less than 1 wt. %, more preferably less than 0.5 wt. %, even more preferably less than 0.1 wt. %, and most preferably less than about 0.01%.

Compositions of the invention have a pH in a range from about 11 to about 14, preferably about 12 to about 14.

In one specific embodiment, the liquid removal composition includes the following components:

| component of | % by weight |
| --- | --- |
| organic quaternary base(s) | about 2.0% to about 15.0% |
| alkali or alkaline earth metal source(s) | about 0.001% to about 2.0% |
| solvent(s) | about 0.01% to about 90.0% |
| chelator/passivation agent(s) | 0.01% to about 5.0% |
| water | about 5.0% to about 40.0% | wherein percentages of the components are percentages by weight, based on total weight of the composition, and wherein the total of the weight percentages of such components of the composition does not exceed 100 weight %. In a preferred embodiment, the liquid removal composition includes about 0.01% to about 1.0% chelator/passivating agent.

In yet another embodiment, the liquid removal composition includes the following components:

| component of | % by weight |
| --- | --- |
| organic quaternary base(s) | about 2.0% to about 15.0% |
| alkali or alkaline earth metal source(s) | about 0.001% to about 2.0% |
| solvent(s), amine(s) or combination thereof | about 0.01% to about 90.0% |
| chelator/passivation agent(s) | 0% to about 5.0% |
| surfactant(s) | 0% to about 5.0% |
| surface interaction enhancing additive(s) | 0.01% to about 5.0% |
| water | about 1.0% to about 40.0% | wherein percentages of the components are percentages by weight, based on total weight of the composition, and wherein the total of the weight percentages of such components of the composition does not exceed 100 weight %.

In a preferred embodiment, the composition includes surfactant at a concentration of about 0.01 wt. % to about 5.0 wt. %.

Such compositions may optionally include additional components, including active as well as inactive ingredients, e.g., stabilizers, dispersants, anti-oxidants, penetration agents, adjuvants, additives, fillers, excipients, etc.

Organic quaternary bases contemplated herein include, but are not limited to, $(NR^1R^2R^3R^4)OH$ where $R^1$, $R^2$, $R^3$ and $R^4$ may be the same as or different from one another and each is independently selected from the group consisting of: hydrogen; straight-chained or branched $C_1$-$C_7$ alkyl groups, e.g., methyl, ethyl, propyl, butyl, pentyl, hexyl and heptyl; $C_6$-$C_{10}$ aryl groups, e.g., benzyl; alcohol groups; any carbon-based organic group such as alkenes, alkynes, etc., wherein the alkyl, alcohol and carbon-based groups may be linear and/or branched and all groups may be substituted; and combinations thereof. The term "aryl" is intended to be broadly construed as referring to carbocyclic (e.g., phenyl, naphthyl) groups and encompassing unsubstituted as well as substituted aryl groups. An example of tetraalkylammonium hydroxide with an alcohol group includes choline. Examples of substituents for substituted aryl groups include one or more of $C_1$-$C_4$ alkyl, $C_1$-$C_4$ alkoxy, and hydroxyl. Preferably, the organic quaternary base includes tetrabutylammonium hydroxide (TBAH), benzyltrimethylammonium hydroxide (BTMAH), tetraethylammonium hydroxide, tetrapropylammonium hydroxide, tetramethylammonium hydroxide (TMAH), and combinations thereof.

Compositions of such type in which the alkali or alkaline earth metal source component includes potassium hydroxide, potassium chloride, other potassium salts having an anion commensurate in size with the chloride and hydroxide ions, and combinations thereof. which are especially advantageous in achieving high efficiency cleaning without adverse effect on the dielectric layer. Other alkali or alkaline earth metal salts are contemplated, with the proviso that the alkali or alkaline earth metal cation has an ionic radius greater than or equal to the ionic radius of potassium.

Suitable solvent species for such composition include, without limitation: amines such as monoethanolamine, triethanolamine, triethylenediamine, methylethanolamine, methyldiethanolamine, pentamethyldiethylenetriamine, dimethyldiglycolamine, 1,8-diazabicyclo[5.4.0]undecene, aminopropylmolpholine, hydroxyethylmorpholine, aminoethylmorpholine, hydroxypropylmorpholine, diglycolamine, N-methylpyrrolidinone (NMP), N-octylpyrrolidinone, N-phenylpyrrolidinone, cyclohexylpyrrolidinone and vinyl pyrrolidinone; sulfur-containing solvents such as tetramethylene sulfone; glycols such as ethylene glycol, propylene glycol (1,2-propanediol) and neopentyl glycol; glycol ethers such as diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether, tripropylene glycol methyl ether, propylene glycol n-propyl ether, dipropylene glycol n-propyl ether, tripropylene glycol n-propyl ether, propylene glycol n-butyl ether, dipropylene glycol n-butyl ether, tripropylene glycol n-butyl ether, and propylene glycol phenyl ether (phenoxy-2-propanol); and combination thereof. Preferably, the solvent species includes 1,2-propanediol, phenoxy-2-propanol, hydroxyethylmorpholine and di(ethylene glycol) methyl ether.

The chelator/passivation agent in such composition can be of any suitable type, and may include, without limitation, triazoles, such as 1,2,4-triazole, or triazoles substituted with substituents such as $C_1$-$C_8$ alkyl, amino, thiol, mercapto, imino, carboxy and nitro groups, such as benzotriazole, tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, and the like, as well as thiazoles, tetrazoles, imidazoles, phosphates, thiols and azines such as 2-mercaptobenzoimidizole, 2-mercaptobenzothiazole, 4-methyl-2-phenylimidazole, 2-mercaptothiazoline, 5-aminotetrazole, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, mercaptobenzothiazole, imidazoline thione, inercaptobenzimidazole, 4-methyl-4H-1,2,4-triazole-3-thiol, 5-amino-1,3,4-thiadiazole-2-thiol, benzothiazole, tritolyl phosphate, indiazole, etc. Suitable chelator species further include glycerols, amino acids, carboxylic acids, alcohols, amides and quinolines such as guanine, urea, adenine, glycerol, thioglycerol, nitrilotriacetic acid, salicylamide, benzoguanamine, melamine, thiocyranuric acid, anthranilic acid, gallic acid, ascorbic acid, salicylic acid, 8-hydroxyquinoline, 5-carboxylic acid-benzotriazole, 3-mercaptopropanol, boric acid, iminodiacetic acid, etc. The chelator is usefully employed to increase the compatibility of the composition with the metals and the dielectric materials used in the semiconductor device. Preferably, the chelator is 2-mercaptobenzimidazole.

Suitable surfactants in the liquid removal compositions of the present invention may include bis-(2-hydroxyethyl) isodecyloxypropylamine oxide, alkoxylated ether amine oxides, as described in U.S. Pat. No. 5,972,875 in the name of Crutcher et al., such as TOMAH AO-455, AO-405, and ether amine oxides derived from a branched chain $C_{10}$ alcohol such as TOMAH AO-14-2.

Although not wishing to be bound by theory, it is thought that the surface interaction enhancing additives coordinate with the hydroxide compounds to increase their ability to efficiently remove the SARC layer material. Surface interaction enhancing additives include, but are not limited to, poly (acrylamide-co-diallyldimethylammonium chloride), poly (acrylamide), poly(acrylic acid), poly (diallyldimethylammonium chloride), diallyldimethylammonium chloride, acrylamide, acetoguanamine, and combinations thereof.

In various preferred embodiments, the liquid removal composition is formulated in the following Formulations A-W, wherein all percentages are by weight, based on the total weight of the formulation:

Formulation A: 3.6% BTMAH; 0.27% potassium hydroxide; 0.08% 2-mercaptobenzimidazole; 15.73% water; 18.83% phenoxy-2-propanol; 56.49% 1,2-propanediol; 5% hydroxyethylmorpholine Formulation B: 3.6% BTMAH; 0.27% potassium hydroxide; 0.08% 2-mercaptobenzimidazole; 15.73% water; 18.83% phenoxy-2-propanol; 56.49% 1,2-propanediol; 5% cyclohexylpyrrolidinone Formulation C: 4.8% BTMAH; 0.27% potassium hydroxide; 0.08% 2-mercaptobenzimidazole; 17.53% water; 42.19% phenoxy-2-propanol; 30.13% 1,2-propanediol; 5% hydroxyethylmorpholine Formulation D: 6.0% BTMAH; 0.27% potassium hydroxide; 0.08% 2-mercaptobenzimidazole; 19.33% water; 40.41% phenoxy-2-propanol; 28.91% 1,2-propanediol; 5% hydroxyethylmorpholine Formulation E: 4.8% BTMAH; 0.27% potassium hydroxide; 0.08% 2-mercaptobenzimidazole; 17.53% water; 39.25% phenoxy-2-propanol; 28.07% 1,2-propanediol; 10% hydroxyethylmorpholine Formulation F: 3.6% BTMAH; 0.27% potassium hydroxide; 1.25% TMAH; 0.08% 2-mercaptobenzimidazole; 19.48% water; 41.00% phenoxy-2-propanol; 29.32% 1,2-propanediol; 5% hydroxyethylmorpholine Formulation G: 3.6% BTMAH; 0.27% potassium hydroxide; 2.5% TMAH; 0.08% 2-mercaptobenzimidazole; 23.23% water; 38.08% phenoxy-2-propanol; 27.24% 1,2-propanediol; 5% hydroxyethylmorpholine Formulation H, 3.6% BTMAH; 0.27% potassium hydroxide; 1.25% TMAH; 0.08% 2-mercaptobenzimidazole; 19.48% water; 38.08% phenoxy-2-propanol; 27.24% 1,2-propanediol; 10% hydroxyethylmorpholine Formulation I: 1.6% BTMAH; 0.27% potassium hydroxide; 2.5% TMAH; 0.08% 2-mercaptobenzimidazole; 10.23% water; 49.74% phenoxy-2-propanol; 35.58% 1,2-propanediol Formulation J: 1.6% BTMAH; 0.27% potassium hydroxide; 2.5% TMAH; 0.08% 2-mercaptobenzimidazole; 20.23% water; 43.91% phenoxy-2-propanol; 31.41% 1,2-propanediol Formulation K: 1.6% BTMAH; 0.27% potassium hydroxide; 2.5% TMAH; 0.08% 2-mercaptobenzimidazole; 20.23% water; 41.0% phenoxy-2-propanol; 29.32% 1,2-propanediol; 5.0% tetramethylene sulfone Formulation L: 1.6% BTMAH; 0.27% potassium hydroxide; 2.5% TMAH; 0.08% 2-mercaptobenzimidazole; 10.23% water; 5% tetramethylene sulfone; 46.83% phenoxy-2-propanol; 33.49% 1,2-propanediol Formulation M: 3.6% BTMAH; 0.27% potassium hydroxide; 2.5% TMAH; 0.08% 2-mercaptobenzimidazole; 13.23% water; 5% tetramethylene sulfone; 43.91% phenoxy-2-propanol; 31.41% 1,2-propanediol Formulation N: 3.6% BTMAH; 0.27% potassium hydroxide; 2.5% TMAH; 0.08% 2-mercaptobenzimidazole; 23.23% water; 5% tetramethylene sulfone; 38.08% phenoxy-2-propanol; 27.24% 1,2-propanediol Formulation O: 3.6% BTMAH; 0.27% potassium hydroxide; 2.5% TMAH; 0.08% 2-mercaptobenzimidazole; 18.23% water; 5% tetramethylene sulfone; 41.00% phenoxy-2-propanol; 29.32% 1,2-propanediol Formulation P: 3.34% BTMAH; 0.27% potassium hydroxide; 1.19% TMAH; 0.08% 2-mercaptobenzimidazole; 8.92% water; 17.24% tetramethylene sulfone; 51.72% 1,2-propanediol; 17.24% di(ethylene glycol) methyl ether Formulation Q: 4.0% BTMAH; 0.27% potassium hydroxide; 2.0% TMAH; 0.08% 2-mercaptobenzimidazole; 7.25% water; 25% tetramethylene sulfone; 51.4% 1,2-propanediol; 10% di(ethylene glycol) methyl ether Formulation R: 3.46% BTMAH; 0.36% potassium hydroxide; 1.5% TMAH; 0.08% 2-mercaptobenzimidazole; 10.05% water; 30% tetramethylene sulfone; 5% phenoxy-2-propanol; 34.55% 1,2-propanediol; 15% di(ethylene glycol) methyl ether Formulation S: 3.46% BTMAH; 0.27% potassium hydroxide; 1.5% TMAH; 0.08% 2-mercaptobenzimidazole; 9.94% water; 20% tetramethylene sulfone; 5% phenoxy-2-propanol; 44.75% 1,2-propanediol; 15% di(ethylene glycol) methyl ether Formulation T: 3.46% BTMAH; 0.27% potassium hydroxide; 1.5% TMAH; 0.08% 2-mercaptobenzimidazole; 10.02% water; 25% tetramethylene sulfone; 5% phenoxy-2-propanol; 39.67% 1,2-propanediol; 15% di(ethylene glycol) methyl ether Formulation U: 3.46% BTMAH; 0.36% potassium hydroxide; 1.5% TMAH; 0.08% 2-mercaptobenzimidazole; 10.13% water; 25% tetramethylene sulfone; 5% phenoxy-2-propanol; 39.47% 1,2-propanediol; 15% di(ethylene glycol) methyl ether Formulation V: 3.73% BTMAH; 0.27% potassium hydroxide; 1.5% TMAH; 0.08% 2-mercaptobenzimidazole; 10.425% water; 25% tetramethylene sulfone; 5% phenoxy-2-propanol; 38.995% 1,2-propanediol; 15% di(ethylene glycol) methyl ether Formulation W: 3.73% BTMAH; 0.36% potassium hydroxide; 1.5% TMAH; 0.08% 2-mercaptobenzimidazole; 10.535% water; 25% tetramethylene sulfone; 5% phenoxy-2-propanol; 38.795% 1,2-propanediol; 15% di(ethylene glycol) methyl ether Further embodiments include cleaning Formulations X-AJ, wherein all percentages are by weight, based on the total weight of the formulation. Formulations X-AJ all contain 15% di(ethylene glycol) methyl ether, 25% tetramethylene sulfone, 5% phenoxy-2-propanol, 0.08% 2-mercaptobenzimidazole, 0.27% potassium hydroxide and the listed percentages of BTMAH, TMAH, water and propylene glycol.

| Formulation | BTMAH % | TMAH % | Water % | Propylene Glycol % |
|---|---|---|---|---|
| X | 1.5 | 0.4 | 9.5 | 43.25 |
| Y | 1.5 | 1.1 | 9.5 | 42.55 |
| Z | 2.5 | 0.4 | 9.5 | 42.25 |
| AA | 2.5 | 1.1 | 9.5 | 41.55 |
| AB | 1.5 | 0.75 | 6.0 | 46.4 |
| AC | 1.5 | 0.75 | 13.0 | 39.4 |
| AD | 2.5 | 0.75 | 6.0 | 45.4 |
| AE | 2.5 | 0.75 | 13.0 | 38.4 |
| AF | 2.0 | 0.4 | 6.0 | 46.25 |
| AG | 2.0 | 0.4 | 13.0 | 39.25 |
| AH | 2.0 | 1.1 | 6.0 | 45.55 |
| AI | 2.0 | 1.1 | 13.0 | 38.55 |

-continued

| Formulation | BTMAH % | TMAH % | Water % | Propylene Glycol % |
|---|---|---|---|---|
| AJ | 2.0 | 0.75 | 9.5 | 42.4 |

Further embodiments include cleaning Formulations AK-AQ, wherein all percentages are by weight, based on the total weight of the formulation. Formulations AK-AQ all contain 3.73% benzyltrimethylammonium hydroxide, 1.5% TMAH, 0.08% 2-mercaptobenzimidazole, 0.27% potassium hydroxide, 5% phenoxy-2-propanol and 12.5% water and the listed percentages of tetramethylene sulfone, di(ethylene glycol) methyl ether, and propylene glycol.

| Formulation | Tetramethylene sulfone % | Di(ethylene glycol) methyl ether % | Propylene Glycol % |
|---|---|---|---|
| AK | 25.0 | 22.5 | 29.42 |
| AL | 25.0 | 30.0 | 21.92 |
| AM | 25.0 | 37.5 | 14.42 |
| AN | 25.0 | 45.0 | 6.92 |
| AO | 15.0 | 30.0 | 31.92 |
| AP | 15.0 | 45.0 | 16.92 |
| AQ | 15.0 | 60.0 | 1.92 |

In yet another embodiment, the liquid removal composition includes Formulations BA-BN, wherein all percentages are by weight, based on the total weight of the formulation. Formulations BA-BN all contain 3.0% BTMAH, 0.2925% potassium hydroxide, and corresponding amounts of the components listed.

| Formulation | poly(acrylamide-co-diallyldimethyl ammonium chloride) % | Di(ethylene glycol) methyl ether % | Water % |
|---|---|---|---|
| BA | 0.075 | 0 | 96.6325 |
| BB | 0.1 | 0 | 96.6075 |
| BC | 0.125 | 0 | 96.5825 |
| BD | 0.15 | 0 | 96.5575 |
| BE | 0.175 | 0 | 96.5325 |
| BF | 0.2 | 0 | 96.5075 |
| BG | 0.25 | 0 | 96.4575 |
| BH | 0.3 | 0 | 96.4075 |
| BI | 0.4 | 0 | 96.3075 |
| BJ | 0.5 | 0 | 96.2075 |
| BK | 0.15 | 2 | 94.5575 |
| BL | 0.15 | 4 | 92.5575 |
| BM | 0.15 | 6 | 90.5575 |
| BN | 0.15 | 8 | 88.5575 |

In still another embodiment, the liquid removal composition includes Formulations BO-BT, wherein all percentages are by weight, based on the total weight of the formulation. Formulations BO-BT all contain 3.0% BTMAH, 0.2925% potassium hydroxide, and corresponding amounts of the components listed.

| Formulation | Additive | Additive amount % | Water % |
|---|---|---|---|
| BO | Polyacrylamide | 0.05 | 96.6575 |
| BP |  | 0.1 | 96.6075 |
| BQ |  | 0.2 | 96.5075 |
| BR | Poly(acrylic acid) | 0.05 | 96.6575 |
| BS |  | 0.1 | 96.6075 |
| BT |  | 0.2 | 96.5075 |

-continued

| Formulation | Additive | Additive amount % | Water % |
|---|---|---|---|

In still another embodiment, the liquid removal composition includes Formulations BU-BZ, wherein all percentages are by weight, based on the total weight of the formulation. Formulations BU-BZ all contain 3.0% BTMAH, 0.2925% potassium hydroxide, 0.15% poly(acrylamide-co-diallyldimethyl ammonium chloride), and corresponding amounts of the components listed.

| Formulation | 2-mercaptobenzimidazole % | Water % |
|---|---|---|
| BU | 0.05 | 96.5075 |
| BV | 0.075 | 96.4825 |
| BW | 0.1 | 96.4575 |
| BX | 0.15 | 96.4075 |
| BY | 0.2 | 96.3575 |
| BZ | 0.25 | 96.3075 |

In another embodiment, the liquid removal composition includes Formulations $BA^2$-$BH^2$, wherein all percentages are by weight, based on the total weight of the formulation. Formulations $BA^2$-$BH^2$ all contain 3.0% BTMAH, 0.2925% potassium hydroxide, 0.15% poly(acrylamide-co-diallyldimethyl ammonium chloride), and corresponding amounts of the components listed.

| Formulation | Surfactant | Surfactant amount % | Water % |
|---|---|---|---|
| BAA | Tomah AO-14-2 | 0.08 | 96.4775 |
| BBB | | 0.1 | 96.4575 |
| BCC | | 0.12 | 96.4375 |
| BDD | | 0.14 | 96.4175 |
| BEE | Tomah AO-405 | 0.08 | 96.4775 |
| BFF | | 0.1 | 96.4575 |
| BGG | | 0.12 | 96.4375 |
| BHH | | 0.14 | 96.4175 |

In yet another embodiment, the liquid removal composition includes Formulations $BI^2$-$BR^2$, wherein all percentages are by weight, based on the total weight of the formulation. Formulations $BI^2$-$BR^2$ all contain 0.15% poly(acrylamide-co-diallyldimethyl ammonium chloride), 0.1% Tomah AO-405, and corresponding amounts of the components listed.

| Formulation | BTMAH % | KOH % | Water % |
|---|---|---|---|
| BII | 1.5 | 0.18 | 98.07 |
| BJJ | 1.5 | 0.405 | 97.845 |
| BKK | 3.0 | 0.18 | 96.57 |
| BLL | 3.0 | 0.405 | 96.345 |
| BMM | 2.25 | 0.2925 | 97.2075 |
| BNN | 2.25 | 0.2925 | 97.2075 |
| BOO | 1.5 | 0.2925 | 97.9575 |
| BPP | 3.0 | 0.2925 | 96.4575 |
| BQQ | 2.25 | 0.18 | 97.32 |
| BRR | 2.25 | 0.405 | 97.095 |

In still another embodiment, the liquid removal composition includes Formulations $BS^2$-$BB^3$, wherein all percentages are by weight, based on the total weight of the formulation. Formulations $BS^2$-$BB^3$ all contain 0.15% poly(acrylamide-co-diallyldimethyl ammonium chloride), 0.1% Tomah AO-405, 5.2% BTMAH and corresponding amounts of the components listed.

| Formulation | tetramethylene sulfone % | di(ethylene glycol) methyl ether % | Water % |
|---|---|---|---|
| BSS | 10 | 15 | 69.55 |
| BTT | 20 | 15 | 59.55 |
| BUU | 10 | 30 | 54.55 |
| BVV | 20 | 30 | 44.55 |
| BWW | 15 | 22.5 | 57.05 |
| BXX | 15 | 22.5 | 57.05 |
| BYY | 15 | 15 | 64.55 |
| BZZ | 15 | 30 | 49.55 |
| BAAA | 10 | 22.5 | 62.05 |
| BBBB | 20 | 22.5 | 52.05 |

In another embodiment, the liquid removal composition includes Formulations $BC^3$-$BH^3$, wherein all percentages are by weight, based on the total weight of the formulation. Formulations $BC^3$-$BH^3$ all contain 0.15% poly(acrylamide-co-diallyldimethyl ammonium chloride), 0.1% Tomah AO-455, 8.25% tetrabutylammonium hydroxide, 10% tetramethylene sulfone, 20% di(ethylene glycol) methyl ether, and corresponding amounts of the components listed.

| Formulation | water % | propylene glycol % |
|---|---|---|
| BCCC | 10 | 51.5 |
| BDDD | 20 | 41.5 |
| BEEE | 30 | 31.5 |
| BFFF | 40 | 21.5 |
| BGGG | 50 | 11.5 |
| BHHH | 60 | 1.5 |

In another embodiment of the invention, the liquid removal composition includes Formulations $BI^3$-$BM^3$, wherein all percentages are by weight, based on the total weight of the formulation. Formulations $BI^3$-$BM^3$ all contain 0.15% poly(acrylamide-co-diallyldimethyl ammonium chloride), 0.1% Tomah AO-405, 8.25% tetrabutylammonium hydroxide, 22% tetramethylene sulfone, 27% di(ethylene glycol) methyl ether, and corresponding amounts of the components listed.

| Formulation | water % | propylene glycol % |
|---|---|---|
| BIII | 10 | 32.5 |
| BJJJ | 20 | 22.5 |
| BKKK | 30 | 12.5 |
| BLLL | 40 | 2.5 |
| BMMM | 42.5 | 0 |

In yet another embodiment of the invention, the liquid removal composition includes Formulations $BN^3$-$BS^3$, wherein all percentages are by weight, based on the total weight of the formulation. Formulations $BN^3$-$BS^3$ all contain 0.15% poly(acrylamide-co-diallyldimethyl ammonium chloride), 0.1% Tomah AO-405, 20% tetramethylene sulfone, 10% di(ethylene glycol) methyl ether, 60% water and corresponding amounts of the components listed.

| Formulation | tetrabutylammonium hydroxide % | propylene glycol % |
|---|---|---|
| BNNN | 8.25 | 1.5 |
| BOOO | 7.15 | 2.6 |
| BPPP | 6.05 | 3.7 |
| BQQQ | 4.95 | 4.8 |
| BRRR | 3.85 | 5.9 |
| BSSS | 2.75 | 7.0 |

In still another embodiment of the invention, the liquid removal composition includes Formulations $BT^3$-CE, wherein all percentages are by weight, based on the total weight of the formulation. Formulations $BT^3$-CE all contain 0.15% poly(acrylamide-co-diallyldimethyl ammonium chloride), 0.1% Tomah AO-405, and corresponding amounts of the components listed, wherein the tetramethylene sulfone:di(ethylene glycol) methyl ether solution has a ratio of 22:27.

| Formulation | BTMAH % | water % | tetramethylene sulfone:di(ethylene glycol) methyl ether % |
|---|---|---|---|
| BTTT | 4.6 | 66 | 29.15 |
| BUUU |  | 56 | 19.15 |
| BVVV |  | 46 | 9.15 |
| BWWW | 4.1 | 66 | 29.65 |
| BXXX |  | 56 | 19.65 |
| BYYY |  | 46 | 9.65 |
| BZZZ | 3.6 | 66 | 30.15 |
| CA |  | 56 | 20.15 |
| CB |  | 46 | 10.15 |
| CC | 3.1 | 66 | 30.65 |
| CD |  | 56 | 20.65 |
| CE |  | 46 | 10.65 |

In another embodiment of the invention, the liquid removal composition includes Formulations CF-CQ, wherein all percentages are by weight, based on the total weight of the formulation. Formulations CF-CQ all contain 0.15% poly(acrylamide-co-diallyldimethyl ammonium chloride), 0.1% Tomah AO-405, 22% tetramethylene sulfone, 27% di(ethylene glycol) methyl ether, and corresponding amounts of the components listed.

| Formulation | BTMAH % | water % | potassium hydroxide/ppm |
|---|---|---|---|
| CF | 4.6 | 46 | 0 |
| CG |  | 46 | 90 |
| CH |  | 46 | 180 |
| CI | 3.2 | 46 | 0 |
| CJ |  | 46 | 90 |
| CK |  | 46 | 180 |
| CL | 4.6 | 32 | 0 |
| CM |  | 32 | 90 |
| CN |  | 32 | 180 |
| CO | 3.2 | 32 | 0 |
| CP |  | 32 | 90 |
| CQ |  | 32 | 180 |

In another embodiment of the invention, the liquid removal composition includes Formulation CR and CS, wherein CR contains 0.15% poly(acrylamide-co-diallyldimethyl ammonium chloride), 22% sulfolane, 27% di(ethylene glycol) methyl ether, 2.9% BTMAH, 0.018% KOH, 17.9% propylene glycol, 0.08% MBI, and 29.95% water, and CS contains 0.15% poly(acrylamide-co-diallyldimethyl ammonium chloride), 22% sulfolane, 27% di(ethylene glycol) methyl ether, 2.9% BTMAH, 0.009% KOH, 17.9% propylene glycol, 0.08% MBI, and 29.96% water.

In yet another embodiment of the invention, the liquid removal composition includes at least one quaternary base, potassium chloride, and at least one chelator/passivating agent enumerated hereinabove. Preferably, the chelator/passivating agent(s) may be selected from the group consisting of urea, 2-mercaptobenzimidazole, 1,2,4-triazole, and combinations thereof. Alternatively, the liquid removal composition includes at least one quaternary base, potassium chloride, urea, and at least one additional chelator/passivating agent. This embodiment of the liquid removal composition includes Formulations DA-DI, wherein all percentages are by weight, based on the total weight of the formulation:

Formulation DA: 2.9% BTMAH; 0.025% KOH; 22% di(ethylene glycol) butyl ether; 0.08% 2-mercaptobenzimidazole; 1.5 wt. % urea; 27% sulfolane; 17.9 propylene glycol; 28.595% water Formulation DB: 2.9% BTMAH; 0.025% KOH; 22% di(ethylene glycol) methyl ether; 0.08% 2-mercaptobenzimidazole; 1.5 wt. % urea; 27% sulfolane; 17.9 ethylene glycol; 28.595% water Formulation DC: 2.9% BTMAH; 0.025% KCl; 22% di(ethylene glycol) methyl ether; 0.08% 2-mercaptobenzimidazole; 1.5 wt. % urea; 27% sulfolane; 17.9 propylene glycol; 28.595% water Formulation DD: 1.5% BTMAH; 0.025% KOH; 22% di(ethylene glycol) methyl ether; 0.08% 2-mercaptobenzimidazole; 1.5 wt. % urea; 27% sulfolane; 17.9 propylene glycol; 27.995% water Formulation DE: 2.9% BTMAH; 0.025% KOH; 22% di(ethylene glycol) butyl ether; 0.08% 2-mercaptobenzimidazole; 1.5 wt. % urea; 27% sulfolane; 17.9 ethylene glycol; 28.595% water Formulation DF: 2.9% TMAH; 0.025% KOH; 22% di(ethylene glycol) methyl ether; 0.08% 2-mercaptobenzimidazole; 1.5 wt. % urea; 27% sulfolane; 17.9 propylene glycol; 28.595% water Formulation DG: 2.9% TMAH; 0.025% KCl; 22% di(ethylene glycol) methyl ether; 0.08% 2-mercaptobenzimidazole; 1.5 wt. % urea; 27% sulfolane; 17.9 propylene glycol; 28.595% water Formulation DH: 2.9% TMAH; 0.025% KCl; 22% di(ethylene glycol) butyl ether; 0.08% 2-mercaptobenzimidazole; 1.5 wt. % urea; 27% sulfolane; 17.9 ethylene glycol; 28.595% water Formulation DI: 2.9% TMAH; 0.025% KCl; 22% di(ethylene glycol) butyl ether; 0.08% 2-mercaptobenzimidazole; 1.5 wt. % urea; 14% sulfolane; 17.9 ethylene glycol; 41.595% water In yet another embodiment of the invention, the liquid removal composition includes about 35 to about 65 wt. % 1,2-propanediol, about 5 to about 25 wt. % tetramethylene sulfone, about 2 to about 15 wt. % phenoxy-2-propanol, about 2 to about 15 wt. % di(ethylene glycol) methyl ether, about 1 to about 6 wt. % benzyltrimethylammonium hydroxide, about 0.5 to about 3 wt. % tetramethylammonium hydroxide, about 0.001 to about 0.3 wt. % 2-mercaptobenzimidazole, about 0.1 to about 0.5 wt. % KOH, and about 5 to about 50 wt. % water. For example, the liquid removal composition is formulated in the following Formulations EA-ED, wherein all percentages are by weight, based on the total weight of the formulation:

Formulation EA: 3.73% BTMAH; 0.27% potassium hydroxide; 1.5% TMAH; 0.08% 2-mercaptobenzimidazole;

12.777% water; 25% tetramethylene sulfone; 5% phenoxy-2-propanol; 36.64% 1,2-propanediol; 15% di(ethylene glycol) methyl ether Formulation EB: 3.73% BTMAH; 0.27% potassium hydroxide; 1.5% TMAH; 0.08% 2-mercaptobenzimidazole; 10.39% water; 25% tetramethylene sulfone; 5% phenoxy-2-propanol; 39.032% 1,2-propanediol; 15% di(ethylene glycol) methyl ether Formulation EC: 3.18% BTMAH; 0.27% potassium hydroxide; 1.5% TMAH; 0.08% 2-mercaptobenzimidazole; 13% water; 25% tetramethylene sulfone; 5% phenoxy-2-propanol; 36.976% 1,2-propanediol; 15% di(ethylene glycol) methyl ether Formulation ED: 3.18% BTMAH; 0.27% potassium hydroxide; 1.5% TMAH; 0.08% 2-mercaptobenzimidazole; 13% water; 20% tetramethylene sulfone; 5% phenoxy-2-propanol; 41.976% 1,2-propanediol; 15% di(ethylene glycol) methyl ether The range of weight percent ratios of the components of the removal composition, when present, are: about 0.001:1 to about 0.3:1 alkali or alkaline earth metal source(s) relative to organic quaternary base(s), more preferably about 0.001:1 to about 0.1:1; about 0.01:1 to about 0.2:1 surface interaction enhancing additive(s) relative to organic quaternary base(s), preferably about 0.03:1 to about 0.07:1; about 0.01:1 to about 0.07:1 surfactant(s) relative to organic quaternary base(s), preferably about 0.03:1 to about 0.05:1; about 1:1 to about 65:1 water relative to organic quaternary base(s), preferably about 2:1 to about 45:1; about 1:1 to about 55:1 solvent(s), amine(s) or combination thereof relative to organic quaternary base(s), preferably about 10:1 to about 30:1; and about 0.01:1 to about 0.1:1 chelator/passivation agent(s) relative to organic quaternary base(s), preferably about 0.01:1 to about 0.03:1.

In yet another embodiment, any of the broadly or specifically described removal compositions of the present invention further include photoresist and/or SARC material residue. Importantly, the residue material and/or hardmask material may be dissolved and/or suspended in the cleaning composition of the invention.

The liquid removal compositions of the invention are easily formulated by simple addition of the respective ingredients and mixing to homogeneous condition. Furthermore, the liquid removal compositions may be readily formulated as single-package formulations or multi-part formulations that are mixed at the point of use. The individual parts of the multi-part formulation may be mixed at the tool or in a storage tank upstream of the tool. The concentrations of the respective ingredients may be widely varied in specific multiples of the removal composition, i.e., more dilute or more concentrated, in the broad practice of the invention, and it will be appreciated that the liquid removal compositions of the invention can variously and alternatively comprise, consist or consist essentially of any combination of ingredients consistent with the disclosure herein.

It will be appreciated that in general removal applications, it is common practice to make highly concentrated forms to be used at extreme dilutions. For example, the removal composition may be diluted at the manufacturer, before use, and/or during use at the fab. Dilution ratios may be in a range from 1 part diluent: 1 part removal composition to 200 parts diluent: 1 part removal composition. It is understood that upon dilution, the weight percent ratios of the components of the removal composition will remain unchanged.

Another aspect of the invention relates to a kit including, in one or more containers, one or more components adapted to form the liquid removal compositions of the invention. Preferably, the kit includes, in one or more containers, organic quaternary base(s), solvent(s), optional alkali or alkaline earth metal source(s), optional chelator/passivation agent(s), optional surfactant(s), and optional surface interaction enhancing additive(s), for combining with the optional water at the fab. Other combinations of liquid removal composition components are contemplated herein. The containers of the kit should be chemically rated to store and dispense the component(s) contained therein. For example, the containers of the kit may be NOWPak® containers (Advanced Technology Materials, Inc., Danbury, Conn., USA).

In cleaning application, the liquid removal composition is applied in any suitable manner to the material to be cleaned, e.g., by spraying the liquid removal composition on the surface of the material to be cleaned, by dipping (in a volume of the liquid removal composition) of the material or article including the material to be cleaned, by contacting the material or article to be cleaned with another material, e.g., a pad, or fibrous sorbent applicator element, that has the liquid removal composition absorbed thereon, by contacting the material or article including the material to be cleaned with a circulating liquid removal composition, or by any other suitable means, manner or technique, by which the liquid removal composition is brought into cleaning contact with material to be cleaned.

As applied to microelectronic device manufacturing operations, the liquid removal compositions of the present invention are usefully employed to remove photoresist and/or SARC materials from substrates and microelectronic device structures on which such material(s) have been deposited.

It is to be understood that the phrase "removing photoresist and/or SARC materials from a microelectronic device" is not meant to be limiting in any way and includes the removal of photoresist and/or SARC materials from any substrate that will eventually become a microelectronic device.

The compositions of the present invention, by virtue of their selectivity for such photoresist and/or SARC materials, relative to other materials that may be present on the microelectronic device substrate and exposed to the liquid removal composition, such as ILD structures, metallization, barrier layers, etc., achieve at least partial removal of the photoresist and/or SARC material(s) in a highly efficient manner.

Importantly, the compositions of the present invention have a low amount of water and as such, are compatible with copper, aluminum and cobalt layers, preferably less than 50 wt % water, more preferably less than 40 wt % water, even more preferably less than 30 wt % water and even more preferably less than 25 wt % water. The copper and/or cobalt etch rates in the presence of the compositions of the invention are less than 5 Å/min, preferably less than 2 Å/min, most preferably less than 1 Å/min.

In use of the compositions of the invention for removing photoresist and/or SARC materials from microelectronic device substrates having same thereon, the liquid removal composition typically is contacted with the device substrate for a time of from about 1 to about 60 minutes, preferably about 20 to about 30 minutes, at temperature in a range of from about 50° C. to about 80° C. Such contacting times and temperatures are illustrative, and any other suitable time and temperature conditions may be employed that are efficacious to at least partially remove the photoresist and/or SARC material from the device substrate, within the broad practice of the invention. As defined herein, "at least partial removal" corresponds to at least 50% removal of photoresist and/or SARC material, preferably at least 80% removal of photoresist and/or SARC material. Most preferably, at least 90% of the photoresist and/or SARC material is removed using the compositions of the present invention.

Following the achievement of the desired cleaning action, the liquid removal composition is readily removed from the substrate or article to which it has previously been applied, e.g., by rinse, wash, or other removal step(s), as may be desired and efficacious in a given end use application of the compositions of the present invention. For example, the device may be rinsed with a rinse solution including deionized water and/or dried (e.g., spin-dry, $N_2$, vapor-dry etc.).

In yet another embodiment, the liquid removal composition of the invention may be utilized in other aspects of the microelectronic device manufacturing process, i.e., subsequent to removal of photoresist and/or SARC material processing step. For example, the liquid removal compositions may be diluted and used as a post-chemical mechanical polishing (CMP) clean.

Alternatively, the cleaning compositions of the invention may be combined with abrasive material and used as a Step II CMP slurry. Step II CMP slurries typically have a high barrier material removal rate relative to the removal rate of copper and dielectric material. For example, abrasive material may be added to the cleaning compositions of the invention (to yield a cleaning composition slurry) and used for the CMP of a microelectronic device having tungsten and Ti/TiN barrier layer materials thereon. If the microelectronic device comprises copper material, a copper inhibiting species is preferably added to the cleaning composition slurry to protect the copper during planarization processes. Abrasives contemplated herein includes silica, alumina, ceria and mixtures thereof Inhibitors contemplated herein include imidazole, aminotetrazole, benzotriazole, benzimidazole, amino, imino, carboxy, mercapto, nitro, alkyl, urea and thiourea compounds, oxalic acid, malonic acid, succinic acid, nitrilotriacetic acid, iminodiacetic acid, and combinations thereof. Preferably, the alternative Step II CMP composition comprises abrasive(s), inhibitor(s), organic quaternary base(s), alkali or alkaline earth metal base(s), co-solvent(s), optionally surfactant(s), and optionally chelating agent(s).

Yet another aspect of the invention relates to the improved microelectronic devices made according to the methods of the invention and to products containing such microelectronic devices.

A still further aspect of the invention relates to methods of manufacturing an article comprising a microelectronic device, said method comprising contacting the microelectronic device with a liquid removal composition for sufficient time to at least partially remove photoresist and/or SARC materials from the microelectronic device having said photoresist and/or SARC materials thereon, and incorporating said microelectronic device into said article, wherein the liquid removal composition includes at least one organic quaternary base, water, optionally at least one alkali or alkaline earth metal source, optionally at least one solvent, amine, or combination thereof, optionally at least one chelator/passivation agent, optionally at least one surfactant, and optionally at least one surface interaction enhancing additive.

The features and advantages of the invention are more fully shown by the illustrative examples discussed below.

EXAMPLE 1

Photoresist and SARC removal was performed on samples of patterned low-k dielectric substrate including photoresist and SARC layers. The samples were dipped in removal solutions X-AJ for 30 minutes at 60° C. and then rinsed with copious amounts of deionized water and dried under nitrogen. The percent removal of photoresist and SARC material from the patterned wafer was approximated using scanning electron microscopy. The results are tabulated in Table 1 hereinbelow.

TABLE 1

Cleaning results for formulations X-AJ.

| Formulation | Percent Cleaning |
|---|---|
| X | 85% |
| Y | 98% |
| Z | 98% |
| AA | 99% |
| AB | 99% |
| AC | 99% |
| AD | 97% |
| AE | 99% |
| AF | 67% |
| AG | 99% |
| AH | 83% |
| AI | 93% |
| AJ | 87% |

EXAMPLE 2

Photoresist and SARC removal was performed on samples of patterned low-k dielectric substrate including photoresist and SARC layers. The samples were dipped in removal solutions AK-AQ for 30 minutes at 60° C. and then rinsed with copious amounts of deionized water and dried under nitrogen. The percent removal of photoresist and SARC material from the patterned wafer was approximated using scanning electron microscopy. The results are tabulated in Table 2 hereinbelow.

TABLE 2

Cleaning results for formulations AK-AQ.

| Formulation | Percent Cleaning |
|---|---|
| AK | 100% |
| AL | 100% |
| AM | 100% |
| AN | 100% |
| AO | 100% |
| AP | 100% |
| AQ | 100% |

EXAMPLE 3

SARC removal was performed on samples of patterned low-k dielectric substrate including SARC layers. The samples were dipped in removal solutions BA-BN for 30 minutes or 60 minutes at 40° C. and then rinsed with copious amounts of deionized water and dried under nitrogen. The percent removal of SARC material from the patterned wafer was approximated using scanning electron microscopy. The results are tabulated in Table 3 hereinbelow.

TABLE 3

Cleaning results for formulations BA-BN.

| Formulation | SARC Removal at 30 minutes/% | SARC Removal at 60 minutes/% |
|---|---|---|
| BA | 5 | 8 |
| BB | 10 | 97 |

TABLE 3-continued

Cleaning results for formulations BA-BN.

| Formulation | SARC Removal at 30 minutes/% | SARC Removal at 60 minutes/% |
|---|---|---|
| BC | 20 | 100 |
| BD | 50 | 100 |
| BE | 20 | 95 |
| BF | 40 | 85 |
| BG | 50 | 100 |
| BH | 60 | 100 |
| BI | 70 | 100 |
| BJ | 70 | 100 |
| BK | 70 | 100 |
| BL | 85 | 100 |
| BM | 95 | 100 |
| BN | 95 | 100 |

EXAMPLE 4

SARC removal was performed on samples of patterned low-k dielectric substrate including SARC layers. The samples were dipped in removal solutions BO-BT for 30 minutes or 60 minutes at 40° C. and then rinsed with copious amounts of deionized water and dried under nitrogen. The percent removal of SARC material from the patterned wafer was approximated using scanning electron microscopy. The results are tabulated in Table 4 hereinbelow.

TABLE 4

Cleaning results for formulations BO-BT.

| Formulation | SARC Removal at 30 minutes/% | SARC Removal at 60 minutes/% |
|---|---|---|
| BO | 70 | 80 |
| BP | 40 | 50 |
| BQ | 30 | 40 |
| BR | 80 | 95 |
| BS | 90 | 100 |
| BT | 80 | 95 |

EXAMPLE 5

Copper etch rates were determined on samples of 1000 Angstrom thick blanket PVD copper wafers. The samples were dipped in removal solutions BU-BZ for 60 minutes at 50° C., with or without stirring (at 60 minutes, 48 hours, and 72 hours), and then rinsed with copious amounts of deionized water and dried under nitrogen. The copper etch rate was determined using 4 point probe resistivity measurements. The results are tabulated in Table 5 hereinbelow.

TABLE 5

Copper etch rate results for formulations BU-BZ.

| Formulation | Cu etch rate (with stirring)/ Å min$^{-1}$ | Cu etch rate (without stirring)/ Å min$^{-1}$ | Cu etch rate (without stirring at 48 hours)/ Å min$^{-1}$ | Cu etch rate (without stirring at 72 hours)/ Å min$^{-1}$ |
|---|---|---|---|---|
| BU | 0.029 | 0.062 | 0.081 | 0.190 |
| BV | 0.062 | 0.007 | 0.123 | 0.271 |
| BW | 0.022 | 0.015 | 0.031 | 0.116 |
| BX | 0.086 | 0.041 | 0.335 | 0.108 |
| BY | 0.088 | 0 | 0.040 | 0.115 |
| BZ | 0.070 | 0.138 | 0.060 | 0.120 |

EXAMPLE 6

SARC and crust removal was performed on samples of patterned low-k dielectric substrate including SARC layers. The samples were dipped in removal solutions BA$^2$-BH$^2$ for 30 minutes at 50° C., and then rinsed with copious amounts of deionized water and dried under nitrogen. The percent removal of SARC material and crust from the patterned wafer was approximated using scanning electron microscopy. The results are tabulated in Table 6 hereinbelow.

TABLE 6

Cleaning results for formulations BA$^2$-BH$^2$.

| Formulation | SARC Removal/% | Crust Removal/% |
|---|---|---|
| BAA | 98 | 40 |
| BBB | 100 | 100 |
| BCC | 100 | 100 |
| BDD | 98 | 100 |
| BEE | 100 | 100 |
| BFF | 99 | 100 |
| BGG | 100 | 99 |
| BHH | 98 | 100 |

EXAMPLE 7

SARC removal was performed on samples of patterned low-k dielectric substrate including SARC layers. The samples were dipped in removal solutions BI$^2$-BR$^2$ for 30 minutes or 60 minutes at 50° C. and then rinsed with copious amounts of deionized water and dried under nitrogen. The percent removal of SARC material from the patterned wafer was approximated using scanning electron microscopy. The results are tabulated in Table 7 hereinbelow.

TABLE 7

Cleaning results for formulations BI$^2$-BR$^2$.

| Formulation | SARC Removal at 30 minutes/% | SARC Removal at 60 minutes/% |
|---|---|---|
| BII | 25 | 100 |
| BJJ | 98 | 100 |
| BKK | 25 | 100 |
| BLL | 99 | 100 |
| BMM | 95 | 100 |
| BNN | 90 | 100 |
| BOO | 40 | 100 |
| BPP | 95 | 100 |
| BQQ | 50 | 90 |
| BRR | 99 | 100 |

EXAMPLE 8

SARC removal was performed on samples of patterned low-k dielectric substrate including SARC layers. The samples were dipped in removal solutions BS$^2$-BB$^3$ for 30 minutes at 40° C., and then rinsed with copious amounts of deionized water and dried under nitrogen. The percent removal of SARC material from the patterned wafer was approximated using scanning electron microscopy. The results are tabulated in Table 8 hereinbelow.

TABLE 8

Cleaning results for formulations BS$^2$-BB$^3$.

| Formulation | SARC Removal/% |
|---|---|
| BSS | 30 |
| BTT | 100 |
| BUU | 100 |
| BVV | 90 |
| BWW | 98 |
| BXX | 100 |
| BYY | 95 |
| BZZ | 100 |
| BAAA | 70 |
| BBBB | 100 |

EXAMPLE 9

SARC removal was performed on samples of patterned low-k dielectric substrate including SARC layers. The samples were dipped in removal solutions $BC^3$-$BH^3$ for 30 minutes at 40° C., and then rinsed with copious amounts of deionized water and dried under nitrogen. The percent removal of SARC material from the patterned wafer was approximated using scanning electron microscopy. The results are tabulated in Table 9 hereinbelow.

TABLE 9

Cleaning results for formulations $BC^3$-$BH^3$.

| Formulation | SARC Removal/% |
|---|---|
| BCCC | 10 |
| BDDD | 30 |
| BEEE | 100 |
| BFFF | 95 |
| BGGG | 100 |
| BHHH | 100 |

EXAMPLE 10

SARC removal was performed on samples of patterned low-k dielectric substrate including SARC layers. The samples were dipped in removal solutions $BI^3$-$BM^3$ for 30 minutes at 40° C., and then rinsed with copious amounts of deionized water and dried under nitrogen. The percent removal of SARC material from the patterned wafer was approximated using scanning electron microscopy. The results are tabulated in Table 10 hereinbelow.

TABLE 10

Cleaning results for formulations $BI^3$-$BM^3$.

| Formulation | SARC Removal/% |
|---|---|
| BIII | 5 |
| BJJJ | 40 |
| BKKK | 100 |
| BLLL | 100 |
| BMMM | 100 |

EXAMPLE 11

SARC removal was performed on samples of patterned low-k dielectric substrate including SARC layers. The samples were dipped in removal solutions $BN^3$-$BS^3$ for 30 minutes at 40° C., and then rinsed with copious amounts of deionized water and dried under nitrogen. The percent removal of SARC material from the patterned wafer was approximated using scanning electron microscopy. The results are tabulated in Table 11 hereinbelow.

TABLE 11

Cleaning results for formulations $BN^3$-$BS^3$.

| Formulation | SARC Removal/% |
|---|---|
| BNNN | 85 |
| BOOO | 95 |
| BPPP | 60 |
| BQQQ | 50 |
| BRRR | 30 |
| BSSS | 5 |

EXAMPLE 12

SARC removal was performed on samples of patterned low-k dielectric substrate including SARC layers. The samples were dipped in removal solutions $BT^3$-CE for 30 minutes at 40° C., and then rinsed with copious amounts of deionized water and dried under nitrogen. The percent removal of SARC material from the patterned wafer was approximated using scanning electron microscopy. The results are tabulated in Table 12 hereinbelow.

TABLE 12

Cleaning results for formulations $BT^3$-CE.

| Formulation | SARC Removal/% |
|---|---|
| BTTT | 0 |
| BUUU | 50 |
| BVVV | 100 |
| BWWW | 10 |
| BXXX | 20 |
| BYYY | 95 |
| BZZZ | 0 |
| CA | 10 |
| CB | 70 |
| CC | 0 |
| CD | 5 |
| CE | 50 |

EXAMPLE 13

SARC removal was performed on samples of patterned low-k dielectric substrate including SARC layers. The samples were dipped in removal solutions CF-CQ for 18 minutes or 30 minutes at 50° C. and then rinsed with copious amounts of deionized water and dried under nitrogen. The percent removal of SARC material from the patterned wafer was approximated using scanning electron microscopy. The results are tabulated in Table 13 hereinbelow.

TABLE 13

Cleaning results for formulations CF-CQ.

| Formulation | SARC Removal at 30 minutes/% | SARC Removal at 18 minutes/% |
|---|---|---|
| CF | 100 | 100 |
| CG | 100 | — |
| CH | 100 | — |
| CI | 95 | 40 |
| CJ | 100 | 99 |
| CK | 100 | 100 |
| CL | 100 | — |

TABLE 13-continued

Cleaning results for formulations CF-CQ.

| Formulation | SARC Removal at 30 minutes/% | SARC Removal at 18 minutes/% |
|---|---|---|
| CM | 100 | — |
| CN | 100 | — |
| CO | 100 | 90 |
| CP | 100 | 100 |
| CQ | 100 | 100 |

EXAMPLE 14

SARC and photoresist removal was performed on samples of patterned low-k dielectric substrate including SARC and photoresist layers. The samples were dipped in removal solution CR for 30 minutes at 40° C. and then rinsed with copious amounts of deionized water and dried under nitrogen. 100% removal of the SARC and photoresist material from the patterned wafer was observed using scanning electron microscopy.

EXAMPLE 15

Patterned wafers having post-etch ashless photoresist thereon were contacted with formulations DA-DH for 20 minutes at 50° C. Importantly, the wafers included exposed TEOS and low-k dielectric material. In each case, the photoresist material delaminated from the surface of the wafer and floated in the formulation and/or the rinse water container. FESEM micrographs of each wafer indicated that the photoresist was substantially removed and that the minimum amount of low-k material attack was observed on the wafers contacted with formulations DG and DH.

It was determined that the quaternary base and the KOH/KCl were important components for removing the photoresist from the surface of the wafer.

EXAMPLE 16

Blanketed silicon nitride (SiN, approximately 300 Å thick), Black Diamond™ (BlackD, approximately 10 kÅ thick), and TEOS wafers (approximately 8000 Å thick) were dipped in removal formulations DH and DI at 50° C., 60° C., and 70° C. for 20 minutes to determine the etch rate of the respective materials. Etch rates were determined using a Nanospec. The etch rates of the respective materials are tabulated below. It is noted that FTIR of the unprocessed and the processed BlackD wafer showed that there was no detrimental change in the chemical structure or the dielectric properties of the BlackD wafer after processing.

| Formulation | Temperature | Etch rate SiN/Å min$^{-1}$ | Etch rate BlackD/Å min$^{-1}$ | Etch rate TEOS/Å min$^{-1}$ |
|---|---|---|---|---|
| DH | 60° C. | 0.2 | 0.6 | 3.5 |
|    | 70° C. | 1.5 | 0.25 | 5.7 |
| DI | 50° C. | 0 | 0.1 | 1.35 |
|    | 60° C. | 0 | 0.25 | 4.30 |
|    | 70° C. | 0 | 0.55 | 4.25 |

Patterned wafers having post-etch ashless photoresist thereon were contacted with formulation DH and DI for 20 minutes at 50° C., 60° C., and 70° C., rinsed with DI water, and dried under $N_2$ gas. Importantly, the wafers included exposed TEOS and low-k dielectric material. In each case, the photoresist material delaminated from the surface of the wafer within 1 minute and did not re-deposit on the surface. FESEM micrographs of each wafer indicated that the photoresist was substantially removed therefrom. Processing at 50° C. exhibited the best removal results with the least amount of damage to the low-k dielectric material, as evidenced by the FESEM results and the etch rates of the BlackD and the TEOS.

Accordingly, while the invention has been described herein in reference to specific aspects, features and illustrative embodiments of the invention, it will be appreciated that the utility of the invention is not thus limited, but rather extends to and encompasses numerous other aspects, features, and embodiments. Accordingly, the claims hereafter set forth are intended to be correspondingly broadly construed, as including all such aspects, features, and embodiments, within their spirit and scope.

The invention claimed is:

1. A liquid removal composition comprising at least one organic quaternary base, at least one surface interaction enhancing additive, and optionally at least one component selected from the group consisting of: at least one alkali or alkaline earth metal source; at least one organic solvent; at least one surfactant; at least one chelating agent; and combinations thereof, wherein said at least one surface interaction enhancing additive comprises a species selected from the group consisting of poly(acrylamide-co-diallyldimethylammonium chloride), poly(acrylamide), poly(diallyldimethylammonium chloride), diallyldimethylammonium chloride, acrylamide, acetoguanamine, and combinations thereof, and wherein said liquid removal composition is useful for removing photoresist and/or sacrificial anti-reflective coating (SARC) materials from a microelectronic device having such material(s) thereon.

2. The liquid removal composition of claim 1, wherein the at least one organic quaternary base comprises a compound having the formula $NR^1R^2R^3R^4OH$, wherein $R^1$, $R^2$, $R^3$ and $R^4$ may be the same as or different from one another and are selected from the group consisting of hydrogen, straight-chained $C_1$-$C_6$ alkyl, branched $C_1$-$C_6$ alkyl, substituted $C_6$-$C_{10}$ aryl, and unsubstituted $C_6$-$C_{10}$ aryl, alcohol groups, alkenes, and alkynes.

3. The liquid removal composition of claim 1, wherein the at least one quaternary organic base comprises a compound selected from the group consisting of tetrabutylammonium hydroxide, benzyltrimethylammonium hydroxide (BT-MAH), tetramethylammonium hydroxide (TMAH), and combinations thereof.

4. The liquid removal composition of claim 1, comprising the alkali or alkaline earth metal source, wherein the at least one alkali or alkaline earth metal source comprises a potassium salt selected from the group consisting of potassium hydroxide, potassium chloride, and combinations thereof.

5. The liquid removal composition of claim 1, comprising the organic solvent, wherein the at least one organic solvent comprises a component selected from the group consisting of an amine, a sulfur-containing compound, a glycol, a glycol ether, and combinations thereof.

6. The liquid removal composition of claim 5, wherein the organic solvent comprises a compound selected from the group consisting of monoethanolamine, triethanolamine, triethylenediamine, methylethanolamine, methyldiethanolamine, pentamethyldiethylenetriamine, dimethyldiglycolamine, 1,8-diazabicyclo[5.4.0]undecene, aminopropylmorpholine, hydroxyethylmorpholine, aminoethylmorpholine, hydroxypropylmorpholine, diglycolamine, N-methylpyrrolidinone (NMP), N-octylpyrrolidinone, N-phenylpyrrolidinone, cyclohexylpyrrolidinone, vinyl pyrrolidinone, tetramethyl sulfone, ethylene glycol, propylene glycol, neopentyl glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether, tripropylene glycol methyl ether, propylene glycol n-propyl ether, dipropylene glycol n-propyl ether, tripropylene glycol n-propyl ether, propylene glycol n-butyl ether, dipropylene glycol n-butyl ether, tripropylene glycol n-butyl ether, propylene glycol phenyl ether, and combinations thereof.

7. The liquid removal composition of claim 1, comprising the chelating agent, wherein the at least one chelating agent comprises a species selected from the group consisting of benzotriazole, tolyltriazole, 5-phenyl-benzotriazole, 5-nitrobenzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles, naphthotriazole, 2-mercaptobenzoimidizole, 2-mercaptobenzothiazole, 4-methyl-2-phenylimidazole, 2-mercaptothiazoline, 5-aminotetrazole, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-mentamethylenetetrazole, 1-phenyl-5-mercaptotetrazole, diaminomethyltriazine, mercaptobenzothiazole, imidazoline thione, mercaptobenzimidazole, 4-methyl-4H-1,2,4-triazole-3-thiol, 5-amino -1,3,4-thiadiazole-2-thiol, benzothiazole, tritolyl phosphate, indiazole, guanine, urea, adenine, glycerol, thioglycerol, nitrilotriacetic acid, salicylamide, benzoguanamine, melamine, thiocyranuric acid, anthranilic acid, gallic acid, ascorbic acid, salicylic acid, 8-hydroxyquinoline, 5-carboxylic acid-benzotriazole, 3-mercaptopropanol, boric acid, and iminodiacetic acid.

8. The liquid removal composition of claim 1, comprising the surfactant, wherein said at least one surfactant comprises a species selected from the group consisting of bis-(2-hydroxyethyl) isodecyloxypropylamine oxide, alkoxylated ether amine oxides, ether amine oxides derived from a branched chain $C_{10}$ alcohol, and combinations thereof.

9. The liquid removal composition of claim 1, further comprising photoresist and/or SARC residue material, wherein said photoresist and/or SARC residue material comprises a species selected from the group consisting of: organic photoresist residue; ion-implanted elements selected from the group consisting of boron, arsenic and phosphorus; silicon-containing residue; and plasma-etching gas elements selected from the group consisting of oxygen and fluorine.

10. The liquid removal composition of claim 1, wherein the pH is in a range from about 11 to about 14.

11. The liquid removal composition of claim 1, comprising benzyltrimethylammonium hydroxide and poly(acrylamide-co-diallyldimethylammonium chloride).

12. The liquid removal composition of claim 11, further comprising sulfolane, di(ethylene glycol) methyl ether, KOH, propylene glycol, MBI, and water.

13. A kit comprising, in one or more containers, one or more of the following reagents for forming a liquid removal composition, said one or more reagents selected from the group consisting of at least one organic quaternary base, at least one surface interaction enhancing additive, and optionally at least one component selected from the group consisting of: at least one alkali or alkaline earth metal source; at least one organic solvent; at least one surfactant; at least one chelating agent; and combinations thereof, and wherein the kit is adapted to form the composition of claim 1.

14. A method of removing photoresist and/or SARC material from a microelectronic device having said material thereon, said method comprising contacting the microelectronic device with a liquid removal composition for sufficient time to at least partially remove said material from the microelectronic device, wherein the liquid removal composition comprises at least one organic quaternary base, at least one surface interaction enhancing additive, and optionally at least one component selected from the group consisting of: at least one alkali or alkaline earth metal source; at least one organic solvent; at least one surfactant; at least one chelating agent; and combinations thereof, wherein said at least one surface interaction enhancing additive comprises a species selected from the group consisting of poly(acrylamide-co-diallyldimethylammonium chloride), poly(acrylamide), poly(diallyldimethylammonium chloride), diallyldimethylammonium chloride, acrylamide, acetoguanamine, and combinations thereof.

15. The method of claim 14, wherein the material comprises a layer selected from the group consisting of: photoresist hardened by plasma etching, photoresist hardened by ion implantation, and SARC materials.

16. The method of claim 14, wherein said contacting is carried out at conditions selected from the group consisting of: time of from about 1 minute to about 60 minutes; temperature in a range of from about 30° C. to about 80° C.; and combinations thereof 17. The method of claim 14, further comprising rinsing the microelectronic device with deionized water following contact with the liquid removal composition.

18. A liquid removal composition comprising at least one quaternary base, potassium chloride, and at least one chelator/passivating agent, wherein the chelator/passivating agent comprises a species selected from the group consisting of urea, 2-mercaptobenzimidazole, and combinations thereof.

19. The removal composition of claim 18, wherein the chelator/passivating agent comprises urea.

20. A method of removing photoresist and/or SARC material from a microelectronic device having said material thereon, said method comprising contacting the microelectronic device with the liquid removal composition of claim 18 for sufficient time to at least partially remove said material from the microelectronic device.

* * * * *